United States Patent
Andriessen et al.

(10) Patent No.: US 6,558,575 B2
(45) Date of Patent: May 6, 2003

(54) PERPARATION OF IMPROVED ZNS:MN PHOSPHORS

(75) Inventors: Hieronymus Andriessen, Beerse (BE); Steven Lezy, Antwerpen (BE)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 10/054,014

(22) Filed: Jan. 24, 2002

(65) Prior Publication Data

US 2002/0149025 A1 Oct. 17, 2002

Related U.S. Application Data

(60) Provisional application No. 60/271,308, filed on Feb. 23, 2001.

(30) Foreign Application Priority Data

Feb. 7, 2001 (EP) .................................................. 01000008

(51) Int. Cl.$^7$ ........................... C09K 11/54; C09K 11/56
(52) U.S. Cl. ................................................. 252/301.65
(58) Field of Search ...................................... 252/301.65

(56) References Cited

U.S. PATENT DOCUMENTS 5,274,248 A  12/1993  Yokogawa et al. ........... 257/22

OTHER PUBLICATIONS

Datatabase Inspec 'online!, Institute of Electrical Engineers, Stevenage, GB; Lu S W et al.: "Synthesis and photoluminescence enhancement of Mn2+ doped ZnS nanocrystals" Database accession No. 6829338 XP002170339, Abstract.
European Search Report, EP 01 00 0008, Jun. 22, 2001.

Primary Examiner—C. Melissa Koslow
(74) Attorney, Agent, or Firm—Joseph T. Guy; Nexsen Pruet Jacobs & Pollard, LLC

(57) ABSTRACT

Highly efficient ZnS:Mn phosphors can be obtained by using triazole or diazole compounds during homogeneous precipitation in aqueous medium. Coated layers containing such phosphors can be incorporated in Thin Film Inorganic Light Emitting Diodes.

7 Claims, 2 Drawing Sheets

PERPARATION OF IMPROVED ZNS:MN PHOSPHORS

This application claims the benefit of Provisional application Ser. No. 60/271,308, filed Feb. 23, 2001.

FIELD OF THE INVENTION

The present invention relates to the precipitation of nano-particles of zinc sulfide efficiently doped with manganese ions, and their use in a particular electroluminescent device.

BACKGROUND OF THE INVENTION

ZnS is a well-known phosphor material. It is used in many applications like after-glow phosphors, photon conversion phosphors and electroluminescent phosphors (Cathode Ray Tube displays, Field Emission Displays, Powder Electroluminescent devices, . . . ).

$Mn^{2+}$-ions in ZnS crystals exhibit a high intense luminescence band at 595 upon excitation of the ZnS host at 330 nm, corresponding to the bandgap of ZnS. This excitation can be done by a photon, resulting in photoluminescence or by an electron, resulting in electroluminescence. In both cases an electron from the $3d^5\,6s$ ground state configuration of the $Mn^{2+}$-ion is excited to a higher level. After non-radiative relaxation to the $3d^5\,4g$ configuration, the electron can decay to the ground state while emitting a photon (luminescence).

From the above it is clear that the more luminescent centres can be incorporated in the phosphor host, the more photons can be emitted for a given amount of host material. The maximum solubility of MnS in ZnS is about 40% at room temperature. This means that on theoretical grounds, a 40% doping level of $Mn^{2+}$ in ZnS will yield the highest emission. However at these high concentration, concentration quenching of the luminescence occurs, and hence the emission efficiency will drastically decrease. With electron spin resonance techniques it can be nicely shown that the quenching is due to energy transfer from the excited $Mn^{2+}$ to another neighbouring (non-excited) $Mn^{2+}$-ion. This means that for an efficient doping the $Mn^{2+}$-ions should be isolated from each other in the ZnS lattice.

Experimentally and theoretically the maximum doping level of luminescent $Mn^{2+}$-ions in ZnS is 4%. Above this concentration statistical clustering of $Mn^{2+}$ will inevitably start to occur, and hence luminescence quenching will result.

ZnS can be doped by $Mn^{2+}$ by calcinating bulk ZnS and MnS at high temperatures, usually at 700–900° C. MnS migrates slowly into the ZnS-lattice. Process optimization (time, temperature, atmosphere, . . . ) leads to highly efficient doped ZnS:Mn phosphors.

$Mn^{2+}$ can also be incorporated in the ZnS-lattice during coprecipitation of $Zn^{2+}$ and $Mn^{2+}$ with $S^{2-}$-ions. However, it seems to be very difficult to obtain high efficient emitting phosphors with more than 1 at % $Mn^{2+}$.

Recently[1–8] many reports were published concerning ZnS nano-particles and doped ZnS:Mn nano-particles prepared by using precipitation techniques. Homogeneous co-precipitation of MnS with ZnS is a simple and straightforward technique to incorporate luminescent $Mn^{2+}$ centres. However, the yield is in most cases low (only about 25% of the added manganese ions will be incorporated in the ZnS lattice). But even worse, concentration quenching starts already at concentrations as low as 1 at %.

In the literature[9–10] addition of methacrylic acid or poly methyl methacrylate during precipitation of ZnS:Mn are described as to enhance the luminescence efficiency. Also addition of 3-methacryloxypropyl trimethoxysilane[11] is ascribed as to enhance the resulting luminescence efficiency.

Many applications for these new class of nano-structured ZnS:Mn phosphors can be thought of as was stated in the introduction.

At present several thin film electroluminescent devices (ELDs) exist or are still in development. They are all characterized by one (or more) electroluminescent active layer(s) sandwiched between two electrodes, of which at least one is transparent. These emitting layers can be organic, inorganic or composite. In analogy with the Oligomeric Light Emitting Diodes (OLEDs) and Polymer Light Emitting Diodes (PLEDs), devices containing inorganic nano-semiconductors will be called hereinafter Inorganic Light Emitting Diodes (ILEDs) or Thin Film Inorganic Light Emitting Diodes.

Recently, several research groups reported electroluminescence[12–16] from inorganic semiconducting nano particles (ILEDs).

Colvin et al.[12] reported on the electroluminescence of CdSe nano-particles stabilized by hexane dithiol. They demonstrated EL for two devices comprising a spincoated double layer of CdSe and PPV (poly(phenylenevinylene)) on ITO and covered it with an evaporated Mg electrode. Depending on the voltage they observed emission from the CdSe (lower voltages) or from the PPV (higher voltages).

Electroluminescence of CdSe quantum-dot/polymer composites was also reported by Dabbousi et al.[13]. They spincoated on ITO one single layer of CdSe nano-particles stabilized with trioctylphosphine oxide and mixed with a polymeric hole transporter (PVK) and an electron ransport species (an oxadiazole derivative of PVK, t-Bu-PBD, which is polybenzodiazole). An aluminum electrode was subsequently evaporated. The system showed electroluminescence in reverse bias, and depending on the applied voltage the emission spectrum of the CdSe quantum dots or PVK was observed.

Gao et al.[14] reported on the electroluminescence of self-assembled films of PPV and CdSe nano-particles. They could observe electroluminescence from the CdSe particles and/or from the PPV, depending on the applied voltage.

These examples demonstrate the possible use of inorganic nano-particles with semiconductor properties as Light Emitting Diodes (ILEDs), in analogy with the OLEDs. However, the use of Cd- or Se-compounds can not be recommended due to environmental problems that can be expected.

Huang et al.[15] reported the photo- and electroluminescence of a single layer of ZnS:Cu nanocrystals spincoated on a ITO substrate and evaporated with an aluminum electrode. ZnS and $Cu_xS$ are much more environmental friendly compared to CdSe. Also there was no need for organic hole or electron transporters, which can cause stability problems as is known in the organic PELDs. The drawback of their system lies in the fact that the synthesis of the ZnS:Cu particles is quite cumbersome and results in low yields. Polystyrene sulphonic acid is used as polyelectrolyte on which Zn and Cu ions are attached. Subsequently this polyelectrolyte is solved in dimethylformamide and reacted with $H_2S$. By this way $ZnS:C_xS$ particles are formed.

Que et al.[16] reported photo- and electroluminescence from a copper doped ZnS nanocrystals/polymer composite. The synthesis of the nano-particles was carried out by using the inverse microemulsion method. After washing and drying the ZnS:Cu powder was redispersed in MEK with PMMA as a binder and spincoated on ITO and evaporated with an aluminum electrode. Green electroluminescence could be observed in both bias directions at 5 V. The drawback of the fabrication of this device is the low concentrations of the ZnS:Cu dispersion that can be obtained (ca $10^{-3}$ M). Further it needs a well defined two phase system (soap/water). Also a drawback for future industrial application could be the solvent based spincoating dispersion.

REFERENCES (1) Eshuis A.; van Elderen G. R. A.; Koning C. A. J.; Colloids and Surfaces A: Physicochemical and Engineering Aspects (1999), 151, 505–512.
(2) Gallagher, D.; Heady, W. E.; Racz, J. M.; Bhargava, R. N.; J. Mater. Res. (1995), 10(4), 870–6.
(3) Murase, N.; Jagannathan, R.; Kanematsu, Y.; Watanabe, M.; Kurita, A.; Hirata, K.; Yazawa, T.; Kushida, T.; J. Phys. Chem. B (1999), 103(5), 754–760.
(4) Vacassy, Robert; Scholz, Stefan M.; Dutta, Joydeep; Plummer, Christopher John George; Houriet, Raymond; Hofmann, Heinrich; J. Am. Ceram. Soc. (1998), 81(10), 2699–2705.
(5) Yu, I.; Isobe T.; Senna M.; J. Phys. Chem. Solids (1996), 57(4), 373–379.
(6) Xu, S. J.; Chua, S. J.; Liu, B.; Gan, L. M.; Chew, C. H.; Xu, G. Q. Appl. Phys. Lett. (1998), 73(4), 478–480.
(7) Gan, L. M.; Liu, B.; Chew, C. H.; Xu, S. J.; Chua, S. J.; Loy, G. L.; Xu, G. Q.; Langmuir (1997), 13(24), 6427–6431.
(8) Leeb, J.; Gebhardt, V.; Mueller, G.; Haarer, D.; Su, D.; Giersig, M.; McMahon, G.; Spanhel, L.; Institut fuer Silicatchemie, Universitaet Wuerzburg, Wuerzburg, Germany. J. Phys. Chem. B (1999), 103(37), 7839–7845.
(9) Jin C.; Hou K.; Dou K.; Chen Y.; Huang S. and Yu J.; Chinese Sci. Bull. (1995), 40, 1782–1784.
(10) Jin C.; Yu J.; Sun L.; Dou K.; Hou S.; Zhao J.; Chen Y. and Huang S.; J. Lumin. (1996), 66&67, 315–318.
(11) Lu, Songwei, Lee, B. I., Wang, Z. L., Summers, C., "Synthesis and Luminescence Enhancement of manganese Doped ZnS nanocrystals," submitted to *J. of Luminescence*.
(12) Colvin V. L., Schlamp M. C. & Alivisatos A. P., Nature (1994), Vol 370, 354–357.
(13) Dabbousi B. O., Bawendi M. G., Onitska O. and Rubner M. F., Appl. Phys. Lett. (1995) 66 (11) 1316–1318.
(14) Gao M., Richter B., Kirstein S. and Möhwald H., J. Phys. Chem. B (1998), 102, 4096–4103.
(15) Huang J., Yang Y., Xue S., Yang B., Liu S., Shen J. Appl/. Phys. Lett. (1997) 70(18), 2335–2337.
(16) Que, Wenxiu; Zhou, Y.; Lam, Y. L.; Chan, Y. C.; Kam, C. H.; Liu, B.; Gan, L. M.; Chew, C. H.; Xu, G. Q.; Chua, S. J.; Xu, S. J.; Mendis, F. V. C.; Appl. Phys. Lett. (1998), 73(19), 2727–2729.

OBJECTS OF THE INVENTION

It is the object of the present invention to provide a process for the preparation of a nanoparticle dispersion of zinc sulfide doped in a very efficient way with manganese ions (ZnS:Mn).

It is a further object of the present invention to provide such a process wich is easy and economical from the manufacturing point of view.

It is still a further object of the present invention to provide a Thin Film Inorganic Light Emitting Diode comprising a coated layer containing such an improved ZnS:Mn dispersion.

SUMMARY OF THE INVENTION

The objects of the present invention are realized by providing a process for the preparation of a nanoparticle dispersion of zinc sulfide doped with manganese ions (ZnS:Mn) comprising the step of performing a precipitation by mixing appropriate aqueous solutions of zinc cations, sulfide anions and manganese cations, characterized in that one or more of said aqueous solutions further contains a triazole or diazole compound.

A Thin film Inorganic Light Emitting Diode comprising a coated layer containing such a ZnS:Mn dispersion also belongs to the scope of the present invention.

BRIEF DESCRIPTION OF THE DRAWINGS

FIG. 1 illustrates the construction of an ILED device according to example 3 (see furtheron).

DETAILED DESCRIPTION OF THE INVENTION

Figures 1A, 1E:
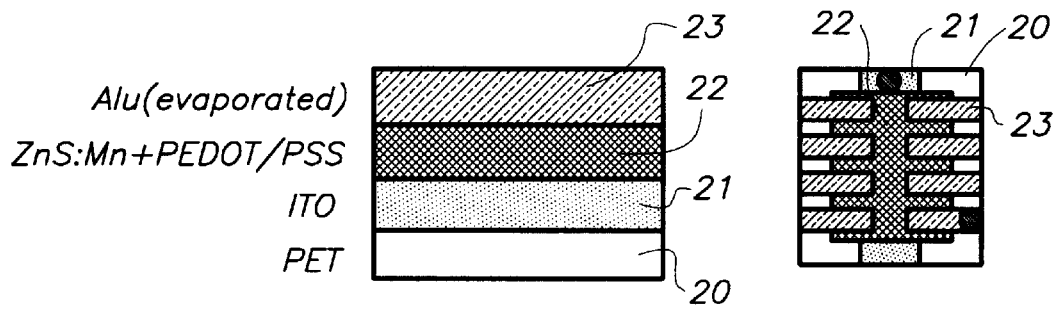
FIG. 1a represents the layer arrangement. It comprises a PET substrate 20, a first conductive ITO layer 21, a luminescent layer 22, and a second electrode layer of evaporated aluminum 23.
FIG. 1e represents a top view of the complete patterned ILED. 31 represents a direct current-voltage source (I/V source) connected to the ITO electrode and the aluminum electrode via contact points 32 and 33.

The present invention will now be explained on the hand of a preferred embodiment.

In a preferred embodiment the precipitation occurs according to the double jet principle wherein a first aqueous solution and a second aqueous solution are added simultaneously to a third aqueous solution. In a particularly preferred embodiment this first aqueous solution contains the zinc ions, e.g. zinc acetate, and manganese ions, e.g. manganese acetate. The second aqueous solution contains sulfide ions. The third aqueous solution also contains a small amount of zinc ions, e.g. zinc acetate.

It is the essence of the present invention that the precipitation of the ZnS:Mn particles occurs in the presence of a triazole or diazole compound. In principle this triazole or diazole compound may be added to any of the aqueous solutions involved in the precipitation, or it can be divided between the different solutions. However, most preferably, the triazole or diazole compound is incorporated into the third solution.

Preferred triazole compounds are triazolo-pyrimidine compounds. A preferred triazolo-pyrimidine compound is compound is 5-methyl-1,2,4-triazolo-(1,5-a)-pyrimidine-7-ol, with following chemical formula:

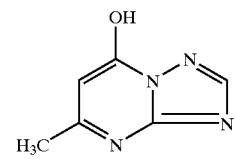

It is very surprising and theoretically unclear why the triazole or diazole compounds used in accordance with the present invention enhance the building-in of $Mn^{2+}$ luminescent centres.

The resulting nanoparticle dispersion, or predispersion as it will be called in the examples, has to be washed and concentrated. This is preferably done by a diafiltration treatment. The diafiltration is preferably performed in the presence of a compound capable of preventing agglomeration of nanoparticles. The nature of this compound is not restricted to a particular chemical class but can be chosen from various chemical types. Preferred compounds are polyphosphoric acid or a polyphosphate such as sodium polyphosphate, a hexametaphosphate such as sodium hexametaphosphate, glycerol and thioglycerol.

In a next step a surfactant may be added to the concentrated dispersion. Any of the numerous known surfactants can be used but a preferred product is a commercial saponine.

The ZnS:Mn dispersion prepared as described above can be usefully incorporated by coating into a so-called Thin Film Inorganic Light Emitting Device. It is explicitly considered that such a device belongs to the scope of the present invention. In this type of device the ZnS:Mn dispersion probably functioning as n-type semiconductor has to be combined with a p-type semiconductor in order to give rise to an Inorganic Light Emitting Diode. The ZnS:Mn dispersion and the p-type semiconductor can be incorporated in two essentially different ways. They can be mixed and coated together in just one layer, or they can be coated separately in a double layer assemblage.

Such a Thin Film Inorganic Light Emitting Diode shows following layer arrangement, in order:

(1) a first conductive electrode,
(2) either,
  one coated layer comprising a mixture of (a) a nanoparticle dispersion of zinc sulfide doped with manganese ions (ZnS:Mn) prepared by a process as explained above, and (b) a p-type semiconductor, or,
  a coated double layer assemblage comprising one layer containing a nanoparticle dispersion of zinc sulfide doped with manganese ions (ZnS:Mn) prepared by a process as explained above, and another layer containing a p-type semiconductor,
(3) a second conductive electrode,
  with the proviso that at least one of said first and second electrodes is transparent.

This construction will now be explained in more detail.

Preferred p-type semiconductors are a nanoparticle dispersion of $Cu_xS$ and a polythiophene/polymeric polyanion complex.

The $Cu_xS$ dispersion is prepared by a precipitation reaction similar to the preparation of the ZnS:Mn dispersion. Appropriate solutions of copper ions and sulfide ions are mixed preferably also according to the double jet principle. The resulting predispersion is washed and concentrated also preferably by diafiltration and/or ultrafiltration, and preferably also in the presence of a compound preventing agglomeration.

The preparation of a polythiophene/polymeric polyanion complex is explained in EP 0 444 957. Most preferred is a poly(3,4-ethyleneoxythiophene)/polystyrene sulphonate complex (PEDOT/PSS).

To the coating solutions of the mixture of the ZnS:Mn dispersion and of the p-type semiconductor, or to the coating solutions of the two separate ingredients one or more binders may be added, although their presence is not essential.

Preferred binders are aqueous solutions of polyvinyl alcohol (PVA), polyvinyl pyrrolidone (PVP), polystyrene sulphonic acid (PSSH) and a complex of poly(3,4-ethylenedioxythiophene) and polystyrene sulphonic acid (PEDOT/PSSH). Adding of these binders improves the stability of the dispersions and leads to better layers.

Single or double layer (2) is incorporated in an Inorganic Light Emitting Diode as follows. The coating composition of the mixture, or the separate coating compositions is (are) coated on a patterned first conductive electrode. This conductive electrode is preferably an ITO (Indium Tin Oxide) electrode. An ORGACON conductive foil (trade name of Agfa-gevaert N.V.) can also be used. Thin transparent electrodes of evaporated Ag, Au, . . . can also be used. The transparent electrode is preferably applied on top of a plastic substrate, e.g. a polyester substrate such as a polyethylene terephthalate substrate, but a glass substrate can also be used. In case the top-electrode (second electrode) is transparent, a non-transparent electrode on glass or plastic can also be used (e.g. Al, Ca, Ag, Mg, Au, etc.) as first electrode. The coating composition(s) can be applied by any suitable coating technique. For the manufacturing of a small prototype spincoating is mostly preferred, but for larger areas doctor blade coating or continuous coating techniques such as used in photographic emulsion coating like air knife coating or curtain coating can be used. The obtained thickness of the dispersion layer(s) is dependent from the nature and concentration of the binder, and from the coating conditions. This thickness is preferably between 50 and 1000 nm. Finally, a second conductive electrode is applied on top of the coated layer. At least one of the conductive electrodes must be transparent. In a preferred embodiment the second conductive electrode is an aluminum electrode (cathode) applied by vacuum deposition. Also Ca, Mg, LiF/Al, Ag can be used. In case the bottom electrode used is non-transparent (Al, Ag, . . . ) a transparent electrode should be applied on top of the spincoated doped ZnS layer. This can be done by spincoating a PEDOT/PSS dispersion, or by sputtering an ITO layer on top of it, or by evaporation of a thin and transparent conductive metallic layer like Al, Ag, Au, . . .

When such a device is driven at different direct current bias voltages orange-yellow luminescence at an emission band around 590 can be observed starting from a certain turn-on voltage, usually from 4 V on. In some cases diode behaviour together with electroluminescence in both bias directions is observed, as will be shown furtheron by the examples.

The present invention will now be illustrated by the following examples without however being limited thereto.

EXAMPLES

Example 1

Preparation of Comparison Zn(Mn)S Dispersion 1

The following solutions were prepared:

| Solution 1 | |
|---|---|
| $Zn(AC)_2.2H_2O$ | 471.4 g |
| $Mn(AC)_2.4H_2O$ | 11 g |
| DW | to 1500 ml |
| Solution 2 | |
| $Na_2S.9H_2O$ | 381.8 g |
| NaOH (50%) | 7.7 ml (50%) |
| DW | to 1500 ml |

-continued

| Solution 3 | |
|---|---|
| $Zn(AC)_2 \cdot 2H_2O$ | 11.2 g |
| DW | to 1500 ml |

The Zn(Mn)S dispersion was prepared as follows:

To solution 3, held at 50° C. and stirred at 1500 rpm, solutions 1 and 2 were added simultaneously both at room temperature at a flow rate of 500 ml/min.

250 ml of thioglycerol was added and the dispersion was diafiltrated through a Fresenius F60 cartridge by using a 5% solution of thioglycerol in water. The dispersion was washed until a conductivity of 0.5 mS/cm was reached. The dispersion was further concentrated to a volume of 1600 ml. This is comparison dispersion 1.

Preparation of Comparison Zn(Mn)S-Dispersion 2

The following solution was prepared:

| Solution 4 | |
|---|---|
| $Zn(AC)_2 \cdot 2H_2O$ | 471.4 g |
| $Mn(AC)_2 \cdot 4H_2O$ | 16.5 g |
| DW | to 1500 ml |

The Zn(Mn)S dispersion was prepared as follows:

To solution 3, held at 50° C. and stirred at 1500 rpm, solutions 2 and 4 were added simultaneously both at room temperature at a flow rate of 500 ml/min.

250 ml of thioglycerol was added and the obtained dispersion was diafiltrated through a Fresenius F60 cartridge by using a 5% solution of thioglycerol in water. The dispersion was washed until a conductivity of 0.5 mS/cm was reached. The dispersion was further concentrated to a volume of 1600 ml. This is comparison dispersion 2.

Preparation of the Zn(Mn)S-Dispersion 3 (Invention)

The following solution was prepared:

| Solution 5 | |
|---|---|
| $Zn(AC)_2 \cdot 2H_2O$ | 11.2 g |
| TRI* | 68 g |
| DW | to 1500 ml |

TRI = (5-methyl-1,2,4-triazolo-(1,5-a)-pyrimidine-7-ol)

This Zn(Mn)S dispersion was prepared as follows:

To solution 5, held at 50° C. and stirred at 1500 rpm, solutions 1 and 2 were added simultaneously both at room temperature at a flow rate of 500 ml/min.

250 ml of thioglycerol was added and the obtained dispersion was diafiltrated through a Fresenius F60 cartridge by using a 5% solution of thioglycerol in water. The dispersion was washed until a conductivity of 0.5 mS/cm was reached. The dispersion was further concentrated to a volume of 1600 ml. This is dispersion 3 (invention).

From the three dispersions, 1 ml was taken and put into 2000 ml of water. These were used for the luminescence measurements in a JASCO Spectrofluorometer Model FP-750. Table 1 lists the results from the analysis and measurements.

TABLE 1

| Sample | % Mn versus Zn during precipitation | % Mn versus Zn after analysis of the dispersion* | Fluorescence Intensity at 595 nm (excitation at 310 nm) | Fluorescence Intensity at 595 nm (excitation at 265 nm) |
|---|---|---|---|---|
| Dispersion 1 (control) | 2% (solution 1) | 0.46 | 196 | 425 |
| Dispersion 2 (control) | 3% (solution 4) | 0.78 | 242 | 460 |
| Dispersion 3 (invention) | 2% (solution 1) | 0.77 | 386 | 838 |

*: by Atomic Absorption Spectroscopy

Example 2
Orange-Yellow Light Emitting Double Layer ILED 2.1. Preparation of the $Cu_xS$- and ZnS:Mn-Dispersion The following solutions were prepared:

| Solution 6 | |
|---|---|
| $CuCl_2 \cdot 2H_2O$ | 37.5 g |
| Water | to 600 ml |

| Solution 7 | |
|---|---|
| $Na_2S \cdot 9H_2O$ | 123.4 g |
| NaOH (50%) | 3.1 ml |
| Water | to 600 ml |

| Solution 8 | |
|---|---|
| Thioglycerol | 50 ml |
| Water | to 800 ml |

| Solution 9 | |
|---|---|
| $Zn(acetate)_2 \cdot 2H_2O$ | 150.4 g |
| $Mn(acetate)_2 \cdot 4H_2O$ | 4.85 g |
| Water | to 600 ml |

| Solution 10 | |
|---|---|
| 5-methyl-1,2,4-triazolo-(1,5,-a)-pyrimidine-7-ol | 60 g |
| Water | to 800 ml |

The $Cu_xS$-dispersion was prepared as follows:

To solution 8, stirred at 1500 rpm at room temperature solutions 6 and 7, both held at room temperature, were added simultaneously at a flow rate of 500 ml/min. This is the predispersion G1 comprising $Cu_xS$-particles.

The ZnS:Mn-dispersion was prepared as follows:

To solution 10, stirred at 1500 rpm at 80° C. solution 9 and 7, both held at room temperature, were added simultaneously at a flow rate of 500 ml/min. This is the predispersion G2 comprising ZnS:Mn-particles.

2.2. Washing of the $Cu_xS$- and ZnS:Mn-Dispersions

To 1000 ml of predispersion G1, 1000 ml of a 5% thioglycerol solution in water was added and this dispersion was diafiltrated through a Fresenius F60 cartridge. The dispersion was concentrated to 1000 ml and washed at this level by using 5000 ml of a 5% solution of thioglycerol in water.

After the washing, this dispersion was concentrated by means of the diafiltration set-up to a concentration of about 40 g $Cu_xS/l$. Subsequently, 1 ml of a 12.5% solution of Saponine Quillaya (Schmittmann) in water/ethanol (80/20) solution of per 20 ml dispersion was added. This is dispersion G1.

The dispersion was analysed for its particle size distribution with the Disc Centrifuge Photosedimentometer Brookhaven BI-DCP. A weight average particle size diameter of about 356 nm was obtained whereas a number average of 88 nm was observed.

To 1000 ml of predispersion G2, 1000 ml of a 2% Na-polyphosphate solution in water was added and this dispersion was diafiltrated through a Fresenius F60 cartridge. The dispersion was concentrated to 1000 ml and washed at this level by using 6000 ml of a 2% solution of Na-polyphosphate in water.

After the washing, this dispersion was concentrated by means of the diafiltration set-up to a concentration of about 35 g ZnS/l. Subsequently, 1 ml of a 12.5% solution of Saponine Quillaya (Schmittmann) in water/ethanol (80/20) solution of per 20 ml dispersion was added. This is dispersion G2.

The dispersion was analysed for its particle size distribution with the Disc Centrifuge Photosedimentometer Brookhaven BI-DCP. A weight average particle size diameter of about 122 nm was obtained.

2.3. Preparation of the Thin Film Inorganic Light Emitting Diode

ITO on a PET substrate (175 μm) with a surface conductivity of about 80 Ohm/Sq was patterned using $HNO_3$. Two borders of about 1.5 cm were treated with $HNO_3$ in order to destroy the conductivity. The resulting material comprises a conductive area in the middle of the material with dimensions 6 cm×3 cm. Subsequently dispersion G1 was spincoated on this substrate twice at 1000 rpm. Subsequently dispersion G2 was spincoated on top twice also at 1000 rpm. Both dispersion were applied without the addition of a binder. A 300 nm thick aluminum electrode (cathode) was vacuum deposited on the spincoated double layers at $10^{-6}$ Torr by a mask. The emission area was 25 $mm^2$.

At a forward direct current bias voltage of 8 V, orange-yellow electroluminescence could be observed.

Example 3
Orange-Yellow Light Emitting ILED with Mixture of ZnS:Mn and PEDOT/PSS This example demonstrates that instead of $Cu_xS$, PEDOT/PSS as the p-type semiconductor can be used.

To 10.5 ml of dispersion G2 (ZnS:Mn), 9.5 ml of a 1.2% PEDOT/PSSH-complex dispersion was added. This is dispersion J. This dispersion was further used to construct a LED device similar to example 2 but according to a single luminescent layer version instead of the double layer version of example 2.

Figures 1B, 1C, 1D:
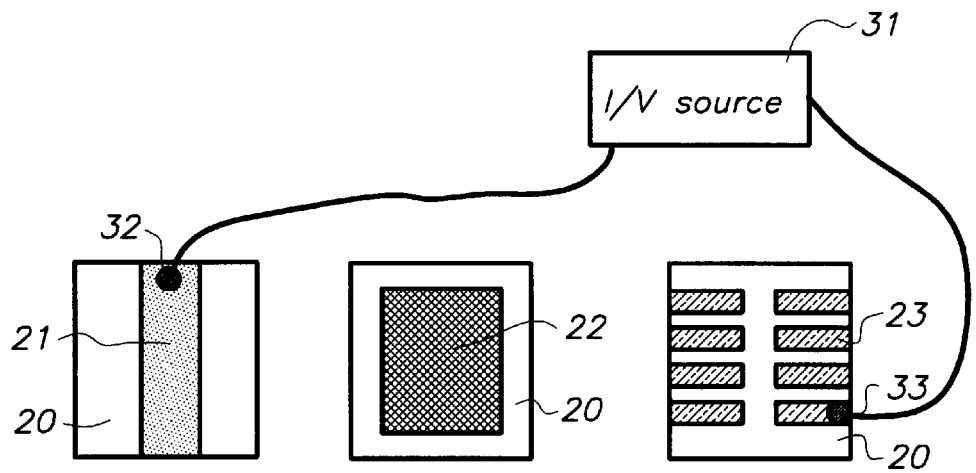
FIGS. 1b, 1c and 1d separately represent the patterning of layers 21, 22, and 23 respectively.

FIG. 1 illustrates the construction of the ILED designed according to this example 3.

Figure 2:
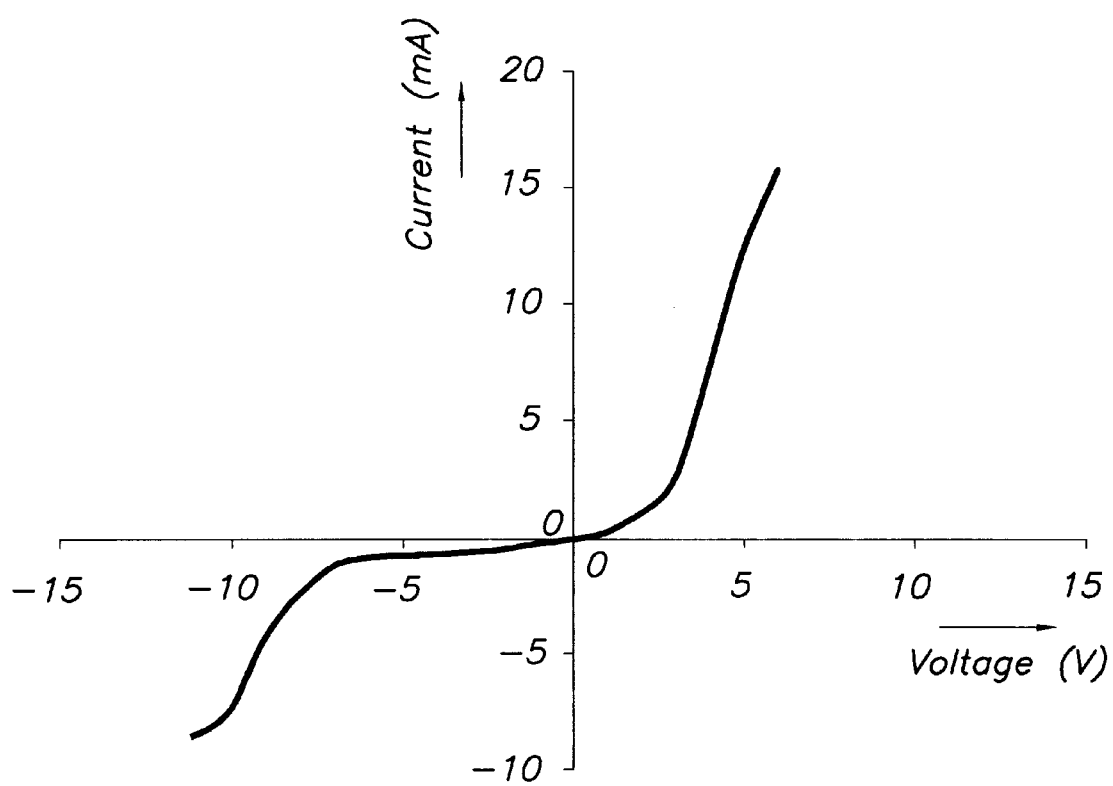
FIG. 2 repesents the direct current-voltage curve (I/V curve) obtained with this ILED of example 3.

At a forward bias electroluminescence could be observed from 4 V, and at reverse bias electroluminescence could be observed from −9 V. The I/V curve is illustrated in FIG. 2.

Example 4
Further Examples of the Preparation of Zn(Mn)S-Dispersions (Invention)

The following solutions were prepared:

| Solution 11 | |
| --- | --- |
| $Zn(AC)_2.2H_2O$ | 11.2 g |
| Product X | y g |
| DW | to 1500 ml |

The Zn(Mn)S dispersions were prepared as follows:

To solution 11, held at 50° C. and stirred at 1500 rpm, solutions 2 and 4 (3 mol % of $Mn^{2+}$ versus $Zn^{2+}$) were simultaneously added both at room temperature at a flow rate of 500 ml/min.

250 ml of thioglycerol was added and this dispersion was diafiltrated through a Fresenius F60 cartridge by using a 5% solution of thioglycerol in water. This dispersion was washed until a conductivity of 0.5 mS/cm was reached. The dispersion was further concentrated to a volume of 1600 ml. These are the dispersions Xx listed in table 2.

From these dispersions, 1 ml was taken and put into 2000 ml of water. These were used for the luminescence measurements in a JASCO Spectrofluorometer Model FP-750. Table 2 lists the results from the analysis and measurements.

Although all products cause more $Mn^{2+}$-ions to be built in the ZnS this resulted only for a few products in a higher yield of photoluminescence.

TABLE 2

| Sample | Product | g of product Xx in solution 11 | % Mn versus Zn after analyse of the dispersion (ICP) | Fluorescence Intensity at 595 nm (excitation at 265 nm) |
| --- | --- | --- | --- | --- |
| Dispersion 2 (control) | — | — | 0.78 | 460 |
| Dispersion X1 | X1 | 46.8 | 1.34 | 494 |
| Dispersion X2 | X4 | 30 | 1.20 | 588 |
| Dispersion X3 | X5 | 60 | 1.19 | 497 |

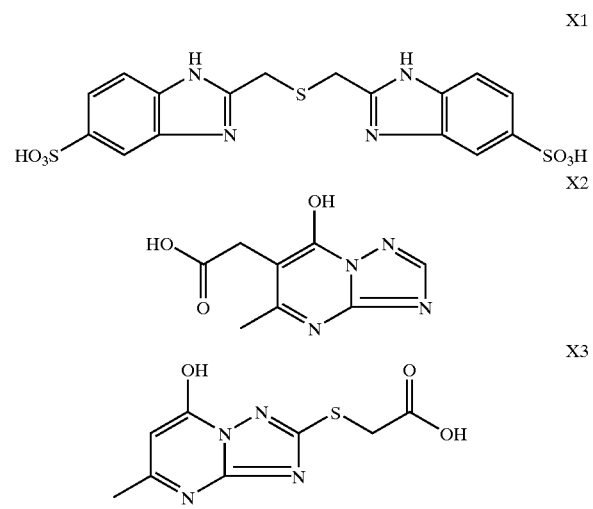

What is claimed is:

1. A process for the preparation of a nanoparticle dispersion of zinc sulfide doped with manganese ions (ZnS:Mn) comprising the step of performing a precipitation by mixing appropriate aqueous solutions of zinc ions, sulfide ions and manganese ions, characterized in that one or more of said aqueous solutions further contains a triazole or diazole compound.

2. A process according to claim 1 wherein said triazolo compound is a triazolo-pyrimidine.

3. A process according to claim 2 wherein said triazole-pyrimidine compound is 5-methyl-1,2,4-triazolo-(1,5-a)-pyrimidine-7-ol.

4. A process according to claim 1 wherein said precipitation is performed according to the double jet principle, whereby a first aqueous solution containing said zinc ions and said manganese ions, and a second aqueous solution containing said sulfide ions are added simultaneously to a third aqueous solution.

5. A process according to claim 4 wherein said third aqueous solution contains said triazole or diazole compound.

6. A process according to claim 1 wherein said process further comprises a diafiltration and/or an ultrafiltration step after said precipitation step.

7. A process according to claim 6 wherein said diafiltration and/or ultrafiltration step is performed in the presence of a compound preventing agglomeration of said doped metal chalcogenide particles.

* * * * *